United States Patent
Sarafianos et al.

(10) Patent No.: US 10,685,923 B2
(45) Date of Patent: Jun. 16, 2020

(54) SECURED ELECTRONIC CHIP

(71) Applicant: STMICROELECTRONICS (ROUSSET) SAS, Rousset (FR)

(72) Inventors: Alexandre Sarafianos, Pourrieres (FR); Jimmy Fort, Puyloubier (FR); Thierry Soude, Puyloubier (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 15/916,183

(22) Filed: Mar. 8, 2018

(65) Prior Publication Data

US 2018/0261560 A1    Sep. 13, 2018

Related U.S. Application Data

(63) Continuation-in-part of application No. PCT/FR2017/050519, filed on Mar. 9, 2017.

(51) Int. Cl.

| H01L 23/00 | (2006.01) |
| H01L 23/60 | (2006.01) |
| G01R 31/26 | (2020.01) |
| H01L 21/74 | (2006.01) |
| H01L 21/66 | (2006.01) |
| H01L 29/36 | (2006.01) |

(52) U.S. Cl.
CPC ........ H01L 23/576 (2013.01); G01R 31/2637 (2013.01); H01L 21/74 (2013.01); H01L 22/34 (2013.01); H01L 23/60 (2013.01); H01L 29/365 (2013.01)

(58) Field of Classification Search
CPC ........ H01L 23/57; H01L 23/576; H01L 23/60
USPC ........................................................ 257/48
See application file for complete search history.

(56) References Cited

U.S. PATENT DOCUMENTS

| 9,121,896 | B2 | 9/2015 | Fornara et al. |
| 9,223,368 | B2 | 12/2015 | Lisart et al. |
| 9,935,062 | B2 | 4/2018 | Lisart et al. |
| 2011/0234307 | A1 | 9/2011 | Marinet et al. |
| 2014/0138686 | A1* | 5/2014 | Wuidart ............... H01L 23/576 257/48 |
| 2014/0138688 | A1* | 5/2014 | Chang ............... G02F 1/136213 257/52 |
| 2015/0214163 | A1* | 7/2015 | Kuenemund ........... H01L 23/57 324/76.11 |
| 2015/0270708 | A1* | 9/2015 | Edwards ............. H01L 27/0255 361/56 |
| 2017/0301635 | A1* | 10/2017 | Sarafianos ............ H01L 21/762 |

FOREIGN PATENT DOCUMENTS

| CN | 105575948 A | 5/2016 |
| CN | 205680680 U | 11/2016 |
| EP | 2 267 772 A1 | 12/2010 |
| EP | 2 369 622 A1 | 9/2011 |
| WO | 2011/155114 A1 | 12/2011 |

* cited by examiner

Primary Examiner — David Vu
Assistant Examiner — Brandon C Fox
(74) Attorney, Agent, or Firm — Seed Intellectual Property Law Group LLP

(57) ABSTRACT

An electronic chip including a plurality of buried doped bars and a circuit for detecting an anomaly of an electric characteristic of the bars.

24 Claims, 3 Drawing Sheets

SECURED ELECTRONIC CHIP

BACKGROUND

Technical Field

The present disclosure relates to electronic chips, and particularly to electronic chips protected against pirate attacks.

Description of the Related Art

Electronic chips containing confidential data, such as bank card data, are capable of undergoing attacks from pirates aiming at determining the chip operation and at extracting therefrom the confidential information. To carry out such attacks, the pirate has several methods.

In a type of attack called fault-injection attack, the pirate scans the surface of the chip in operation with a laser beam which disturbs the activity of the chip. The observation of the consequences of such disturbances, called faults, enables the pirate to successfully complete the attack. To disturb the chip operation, the pirate may also form contacts on the chip surface and apply potentials thereto. The pirate may also place a coil close to the chip surface to emit electromagnetic disturbances.

In another type of attack called focused ion beam attack, the pirate may etch a portion of the back side of an electronic chip. From the etched portion, the pirate may use an ion beam to etch cavities having a diameter of a few micrometers all the way to circuit elements located on the front side. These elements may be components such as transistors, diodes, or conductive tracks connecting these components. After having created electric contacts through these cavities, the pirate operates the chip to successfully complete the attack.

It is desirable to have electronic chips protected against this type of attacks, known devices having various disadvantages and implementation issues.

BRIEF SUMMARY

Thus, an embodiment provides an electronic chip comprising a plurality of buried doped bars and comprising a circuit for detecting an anomaly of an electric characteristic of the bars.

According to an embodiment, the bars are of a first conductivity type and are buried in a substrate of a second conductivity type under the lower level of wells of the first conductivity type, elements of electronic circuits being formed inside and on top of the substrate and inside and on top of the wells.

According to an embodiment, each end of each buried bar is provided with a contact.

According to an embodiment, the bars are buried under an overdoped region of the conductivity type opposite to the conductivity type of the bars.

According to an embodiment, the buried bars are series-connected between first and second nodes, the chip further comprising a circuit for detecting an electric discontinuity between the first and second nodes.

According to an embodiment, the circuit for detecting a discontinuity is capable of applying a signal to the first node and of detecting the absence of a transmission of the signal to the second node.

According to an embodiment, the chip comprises a carrier injection detection circuit capable of biasing the interconnected buried bars and of detecting an anomaly of the buried bar bias current.

According to an embodiment, the chip comprises a resistive element conducting the bias current and a circuit for detecting a voltage across the resistive element.

According to an embodiment, the chip comprises a circuit for detecting an anomaly of the resistance value between two end contacts of each buried bar.

According to an embodiment, each of the buried bars has a contact coupled to a current source, a reference potential being applied to another contact of the bar, the chip further comprising for each of the bars a circuit for detecting an anomaly of the voltage between the contacts of the bar.

According to an embodiment, said detection circuit comprises a discontinuity detection circuit, a carrier injection detection circuit, and a resistance variation detection circuit.

Another embodiment provides a method of manufacturing an electronic chip protected against attacks, comprising the steps of: a) forming buried bars of a first conductivity type in a substrate of a second conductivity type; b) forming wells of the first conductivity type in the upper portion of the substrate, the buried bars being under the lower level of the wells; and c) forming, inside and on top of the substrate and inside and on top of the wells, elements of electronic circuits and a circuit for detecting an anomaly of an electric characteristics of the buried bars.

According to an embodiment, step a) comprises a boron implantation at a dose in the range from $1.5*10^{12}$ to $2.5*10^{12}$ ions/cm$^2$ with an energy greater than 3,500 keV.

According to an embodiment, the method further comprises a step a1) of forming, above the level of the buried bars, an overdoped region of the second conductivity type.

The foregoing and other features and advantages will be discussed in detail in the following non-limiting description of specific embodiments in connection with the accompanying drawings.

DETAILED DESCRIPTION

Figure 1:
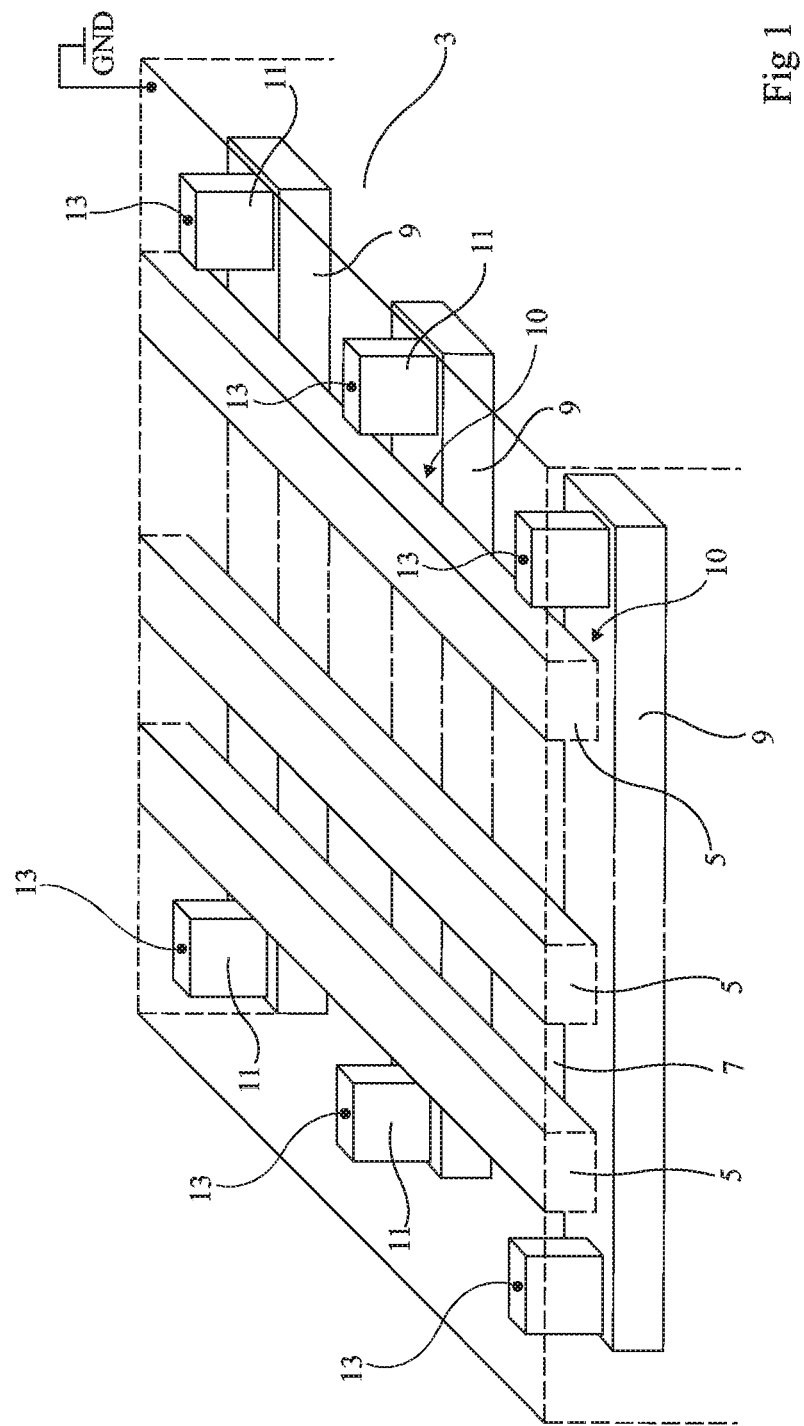
FIG. 1 is a partial simplified perspective view of an embodiment of an electronic chip protected against attacks.

The same elements have been designated with the same reference numerals in the various drawings and, further, the various drawings are not to scale. For clarity, only those steps and elements which are useful to the understanding of the described embodiments have been shown and are detailed. In particular, electronic circuit elements, such as transistors, diodes, and interconnects, arranged at the upper or front surface of a chip, are not shown.

In the following description, when reference is made to terms qualifying a relative position, such as terms "above", "under", "upper", "lower", etc., reference is made to the orientation of the concerned element in FIG. 1. In the present description, term "connected" designates a direct electric connection between two elements, while term "coupled"

designates an electric connection between two elements which may be direct or via one or a plurality of passive or active components, such as resistors, capacitors, inductances, diodes, transistors, etc.

FIG. 1 is a partial simplified perspective view of an embodiment of an electronic chip protected against attacks.

The chip comprises a P-type doped semiconductor substrate 3 including N-type doped portions. Some chip elements are not shown in FIG. 1. N-type doped wells 5 are located in the upper portion of substrate 3. In the shown example, wells 5 form parallel strips separated by P-type doped portions 7 of the substrate 3. Substrate 3 is connected to a ground GND having its potential used as a reference. Elements, not shown, of electronic circuits of the chip, such as transistors interconnected by conductive tracks, are formed inside and on top of wells 5 and portions 7. The circuits are for example logic circuits which contain confidential information coveted by a pirate.

The chip comprises N-type doped bars 9, buried in substrate 3, that longitudinally extend substantially parallel to each other and are arranged at regular intervals under the lower level of wells 5. The bars are separated by wells 5 by portions 10 of the substrate. Each buried bar 9 is thus separated from the other bars 9 and from wells 5 by P-type doped portions. Each of the two ends of each bar 9 is topped with an N-type doped contact area 11 which connects the bar to the upper surface of the substrate. Each contact area 11 is provided with a contact 13.

As an example, buried bars 9 are arranged between two levels located at depths in the range from 1 to 5 µm under the upper surface. Bars 9 may be directed along a direction substantially perpendicular to the directions of longitudinal extension of the strips formed by the wells 5 or may be directed in another direction. As an example, bars 9 have a horizontal dimension, or width, perpendicular to their longitudinal direction, in the range from 1 to 5 µm. The width of the space between bars 9 may be in the range from 1 to 5 µm.

As an example, buried bars 9 may be formed by ion implantation before the forming of contact areas 11 and wells 5. As an example, buried bars 9 are obtained by boron implantation at a dose in the range from $1.5*10^{12}$ to $2.5*10^{12}$ ions/cm$^2$ with an energy greater than 3,500 keV. In a variation, the assembly of portions 10 may be the target of an additional P-type doping intended to create overdoped P-type buried regions therein. The overdoping of portions 10 enables to ascertain with more security that bars 9 are separated from wells 5 by P-type doped regions. The additional doping may be obtained by ion implantation of phosphorus at a dose in the range from $1.5*10^{12}$ and $2.5*10^{12}$ ions/cm$^2$ and with an energy in the range from 4,500 to 5,500 keV.

The buried wells may be connected to different detection circuits included in the chip. Such detection circuits are detailed in the next drawings.

Figure 2:
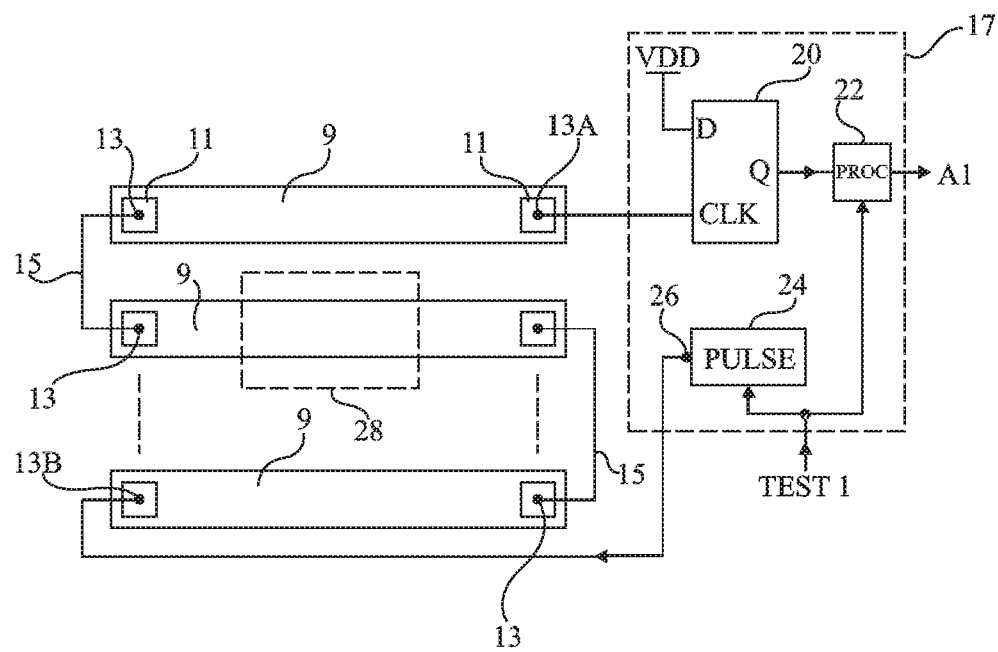
FIGS. 2 and 3 detail examples of detection circuits coupled to buried bars.

FIG. 2 details an example of a discontinuity detection circuit 17 coupled to buried bars 9. Buried bars 9 are shown in top view as provided with contact areas 11 and contacts 13. Buried bar 9 are series-connected between contacts 13A and 13B by connections 15 arranged between contacts 13 of neighboring bars 9.

Detection circuit 17 comprises a flip-flop 20 having its clock input CLK coupled to contact 13A. A positive potential VDD is applied to the D data input of flip-flop 20. The Q output of flip-flop 20 is coupled to an input of a processing circuit (PROC) 22. A pulse generation circuit (PULSE) 24 has an output 26 coupled to contact 13B. Circuits 22 and 24 are activated by a signal TEST1.

Signal TEST1 is activated during a test phase. The test phase for example occurs during a starting phase of the chip.

Before the test phase, the output of flip-flop 20 and the output of pulse generation circuit 24 are at a low level. During the test phase, pulse generation circuit 24 momentarily applies a high potential level to contact 13A. At the end of the test phase, processing circuit 22 activates an alert signal A1 if the potential at the output of flip-flop 20 still is at the low level.

In the absence of an attack, the high potential level momentarily applied to contact 13A forms a pulse signal which is present on the clock input of the flip-flop. The potential at the flip-flop output switches to a high level and remains at this level in the rest of the test phase. No signal A1 is thus transmitted during the test phase. Outside of the test phase, processing circuit 22 is deactivated and no signal A1 is transmitted.

During an attempt of attack by focused ion beam, the pirate forms an opening 28 having a width of a few micrometers to access elements of the chip circuit located on the front surface side. The widths of bars 9 and of the spaces between bars 9 are smaller than the width of opening 28, and thus opening 28 interrupts one at least of buried bars 9 and creates a discontinuity therein. To complete the attack, the pirate operates the chip. On starting of the chip, signal TEST1 is activated. However, the pulse signal is not transmitted all the way to the negative input, which causes the transmission of a signal A1. Detection circuit 17 thus detects an electric discontinuity in series-connected bars 9.

Signal A1 is used by the chip to take countermeasures such as suspending or stopping its activity or destroying confidential data that it contains. The chip is thus protected against focused ion beam attacks.

Figure 3:
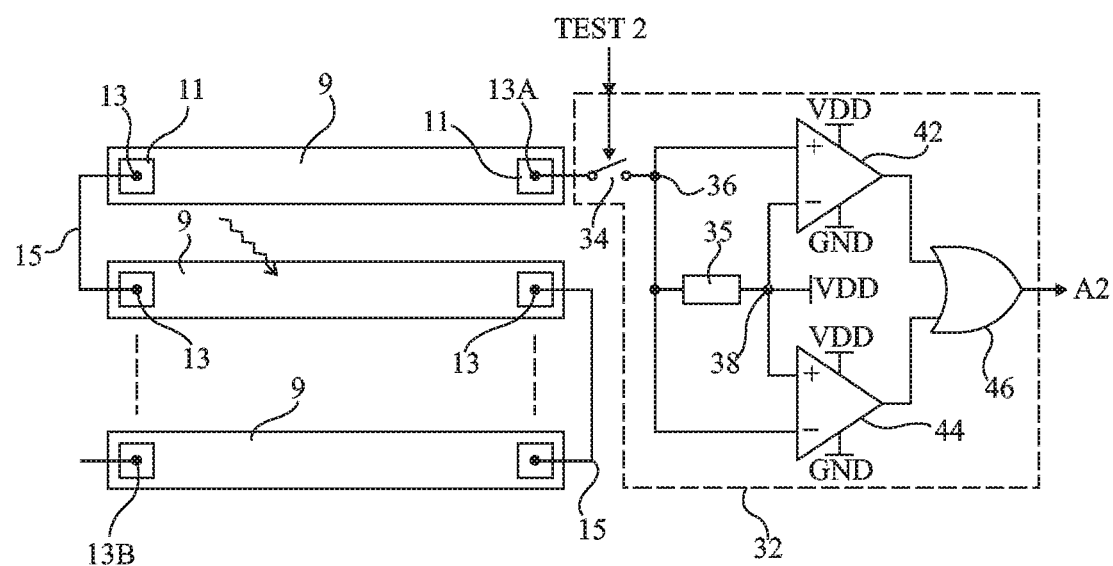

FIG. 3 details an example of a charge carrier injection detection circuit 32 coupled to buried bars 9 shown in top view. Buried bars 9 are series-connected by connections 15 between contacts 13A and 13B. Contact 13B is not connected.

Detection circuit 32 comprises:

a switch 34 coupling contact 13A with a node 36 and controlled by a signal TEST2;

a resistor 35 located between node 36 and a node 38 having a potential VDD applied thereto;

a comparator 42 having its positive input coupled to node 36 and its negative input coupled to node 38;

a comparator 44 having its positive input coupled to node 38 and its negative input coupled to node 36; and an OR gate 46 having its inputs coupled to the outputs of comparators 42 and 44 and having its output supplying an alert signal A2, comparators 42 and 44 being powered between potential VDD and ground.

During the chip operation, signal TEST2 is activated. Switch 34 is on, and buried bars 9 are biased to potential VDD via resistor 35. Substrate 3 being grounded, the P-N junctions between bars 9 and the substrate are blocked. Thereby, no current flowing towards or from the bars, or bias current, flows through resistor 35. Each of comparators 42 and 44 is provided so that its output is not activated when its inputs are at the same potential, and no signal A2 is generated.

During an attack by fault injection by means of a laser, the laser beam causes a photo-injection of carriers into an illuminated P-N junction portion between bars 9 and substrate 3. A bias current then flows through resistor 35 and causes the transmission of alert signal A2. Alert signal A2 may be used to stop the chip or destroy confidential information.

The operation of carrier injection detection circuit 32 is identical to protect the chip against the injection of faults by a pirate who applies potentials to contacts added on the chip or who causes electromagnetic disturbances by means of a coil. Comparators 42 and 44 detect a voltage across resistor 35. When a fault generates a bias current originating from bars 9, comparator 42 is the origin of a signal A2. When a bias current caused by a fault flows towards bars 9, comparator 44 detects this current and a signal A2 appears.

Thus, the chip is advantageously protected against any type of fault injection attack carried out by the injection of charge carriers.

Figure 4:
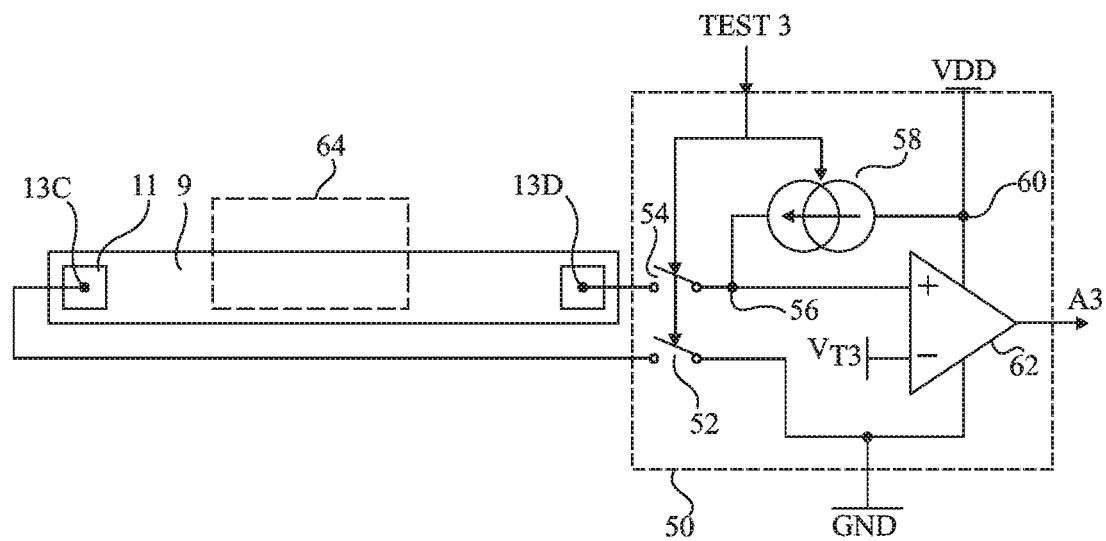
FIG. 4 details a detection circuit connected to a buried bar.

FIG. 4 shows a buried bar 9 connected to a resistance variation detection circuit 50. The chip may comprise a detection circuit for each buried bar. The ends of bar 9 are provided with contacts 13C and 13D. Detection circuit 50 comprises:

a switch 52 coupling contact 13C to ground GND;
a switch 54 coupling contact 13D to a node 56;
a current source 58 between a node 60 of application of a potential VDD and node 56; and
a comparator 62 having its positive input coupled to node 56 and having as a negative input a node of application of a threshold potential $V_{T3}$.

Current source 58 and switches 52 and 54 are controlled by a signal TEST3.

The output of comparator 62 corresponds to an alert signal A3. Comparator 62 detects an anomaly of the voltage between the end contacts of the bar.

A test phase is provided on starting of the chip. During the test phase, each signal TEST3 is successively activated. When signal TEST3 of a detection circuit is activated, a current is injected by current source 58 into buried bar 9 connected to the circuit.

In the absence of an attack, the resistance of buried bar 9 is such that the voltage drop between contacts 13C and 13D remains lower than threshold $V_{T3}$. No signal is transmitted.

In the case of a focused ion beam attack attempt, the pirate digs an opening 64 having a width of a few micrometers which damages a buried bar 9. The bar resistance is increased. When the corresponding signal TEST3 is activated, this resistance variation causes in bar 9 a voltage drop greater than threshold $V_{T3}$. A signal A3 is transmitted and triggers the application of countermeasures which stop the attack attempt.

A pirate attempting to attack the chip may possibly detect the presence of buried bars 9. The pirate may then short bars 9 to preserve the electric continuity thereof. In this case, the detection of an electric discontinuity of the assembly of bars 9, such as the detection by detection circuit 17 of FIG. 2, would not be sufficient to counter the attack. The detection of an anomaly of an electric characteristic, such as the variation of a resistance, of a single one of buried bars 9 enables to efficiently detect focused ion beam attack attempts, even though the pirate attempts to preserve the electric continuity of the bars.

Figure 5:
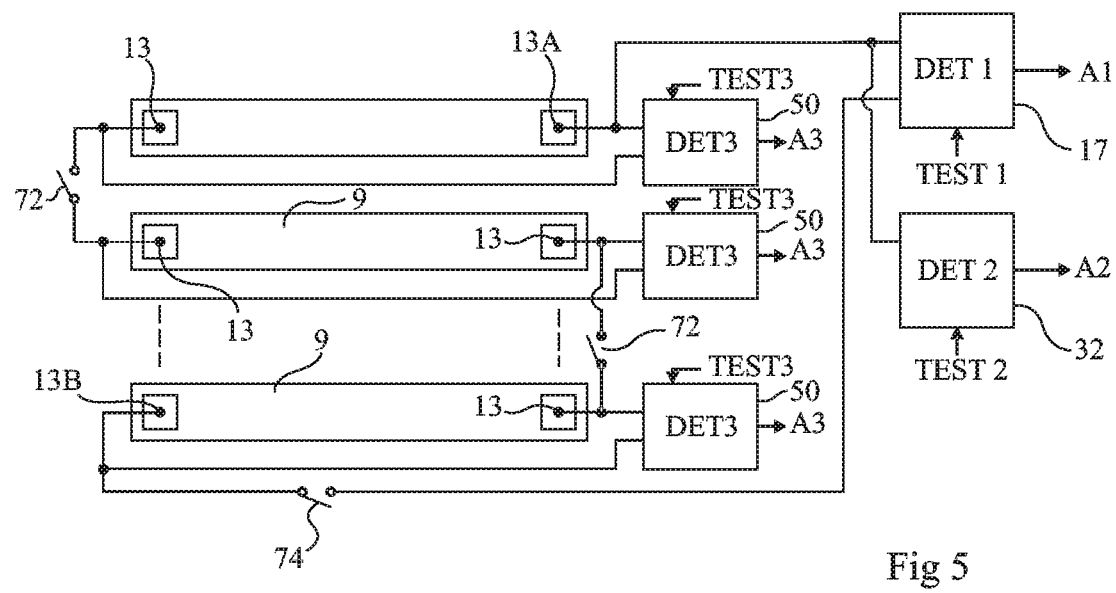
FIG. 5 schematically shows a chip combining the detection circuits described in relation with FIGS. 2, 3, and 4.

FIG. 5 shows buried bars 9 connected to a combination of the previously-described discontinuity, carrier injection, and resistance value variation detection circuits.

Each buried bar 9 has its ends coupled to a circuit 50 (DET3) for detecting a variation of the resistance of the bar. Buried bars 9 may be series-connected between a contact 13A and a contact 13B by an assembly of switches 72. Contact 13A is coupled to a circuit 32 (DET2) for detecting an anomaly of the current for biasing bars 9. A switch 74 couples contact 13B to a circuit 17 (DET1) for detecting an electric discontinuity of bars 9 between contacts 13A and 13B.

On starting of the chip, at a first step, switches 72 are turned on and signal TEST1 is activated. At a second step, switches 72 are turned off to isolate each bar 9 and signals TEST3 are successively activated. During the chip operation, switches 72 are turned on and test signal TEST2 is activated to protect the chip.

During an attack attempt, the pirate modifies an electric characteristic of the assembly of bars or of one of the bars, this characteristic being an electric continuity, a bias current, or the value of a resistance. By detecting an anomaly of this electric characteristic, a detection circuit transmits an alert signal to counter the attack attempt.

The chip is thus advantageously protected against all types of fault injection attacks and against focused ion beam attacks.

The elements dedicated to the chip security occupy the surface area of two detection circuits 17 and 32 for the entire chip and of a circuit 50 of very simple structure for each of the bars. Thus, the portion of the chip surface area dedicated to security is advantageously decreased, and may amount to less than 1% of the chip surface area.

Specific embodiments have been described. Various alterations, modifications, and improvements will occur to those skilled in the art. In particular, in the described embodiments, the detection circuits detect anomalies of an electric continuity, of a bias current, and of an electric resistance. In other embodiments, chips may be equipped with circuits for detecting anomalies of other electric characteristics of the buried bars, capable of being modified during attack attempts.

Further, although, in the described embodiments, a P-type doped substrate contains N-type doped buried bars 9 located under wells, it is possible to reverse the conductivity types. What matters is for each buried bar to be separated from the other bars and from the wells by regions of a conductivity type opposite to that of the bars.

Although, in the embodiment described in relation with FIG. 3, circuit 32 detects an anomaly of the current for biasing series-connected buried bars, it is possible, as a variation, to connect together the buried bars in any other ways, for example, in parallel.

Further, although, in the embodiment described in relation with FIG. 4, each buried bar 9 is connected to a dedicated detection circuit 50, variations are possible where a common detection circuit is successively coupled to a plurality of buried bars, or where a detection circuit detects an anomaly of the resistance of a plurality of series-connected bars. Further, in this embodiment, a resistance anomaly is detected by a detection circuit 50 when the resistance of a buried bar 9 is greater than a threshold. In a variation, a resistance anomaly is detected by a circuit common to two buried bars when the difference between the resistances of two bars is greater than a threshold.

Further, although, in the disclosed embodiments, specific detection circuits have been described, other circuits capable of detecting a resistance anomaly, an electric discontinuity, or an anomaly of a bias current may be implemented.

Further, in embodiments, the buried bars are series-connected by connections. As a variation, such connections may be replaced with portions having the same doping type as the buried bars, and the portions may be buried and formed at the same time as the buried bars.

Various embodiments with different variations have been described hereabove. It should be noted that those skilled in the art may combine various elements of these various embodiments and variations without showing any inventive step. In particular, although an embodiment comprising three types of detection circuits has been described in relation with FIG. 5, other embodiments are possible where only one or two of the three types of circuits are implemented.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic chip comprising:
   a plurality of doped bars of first conductivity type that are buried in a substrate of a second conductivity type, are spaced apart from each other, and extend longitudinally substantially parallel to each other;
   a detection circuit for detecting an anomaly of an electric characteristic of at least one of the bars;
   wells of the first conductivity type formed in the substrate; and
   elements of electronic circuits formed inside and on top of the substrate and inside and on top of the wells, wherein the bars are buried under a lower level of the wells and are spaced apart from the wells.

2. The electronic chip of claim 1, further comprising an overdoped region of the second conductivity type positioned between the bars and the wells, wherein the overdoped region has a higher doping level than the substrate.

3. The electronic chip of claim 1, wherein the buried bars are series-connected to each other between first and second nodes, wherein the detection circuit is a circuit configured to detect an electric discontinuity between the first and second nodes.

4. The electronic chip of claim 3, wherein the detection circuit is configured to apply a signal to the first node and detect an absence of a transmission of the signal to the second node.

5. The electronic chip of claim 1, wherein the bars are electrically connected to each other and the detection circuit is a carrier injection detection circuit configured to bias the bars and detect an anomaly of a bias current of the bars.

6. The electronic chip of claim 5, wherein the detection circuit includes a resistive element conducting the bias current and a voltage detection circuit configured to detect a voltage across the resistive element.

7. The electronic chip of claim 1, further comprising a plurality of end contacts, wherein the bars each include first and second ends respectfully connected to respective first and second end contacts of the plurality of end contacts and the detection circuit includes a circuit for detecting an anomaly of a resistance value between the first and second end contacts of the at least one of the bars.

8. The electronic chip of claim 7, wherein:
   the detection circuit is one of a plurality of detection circuits respectively connected to the buried bars; and
   each detection circuit includes a current source connected to the first end contact for the bar connected to the detection circuit, a reference potential terminal connected to the second end contact for the bar connected to the detection circuit, and a voltage detection circuit configured to detect an anomaly of a voltage between the first and second end contacts for the bar connected to the detection circuit.

9. The electronic chip of claim 1, wherein said detection circuit comprises a discontinuity detection circuit, a carrier injection detection circuit, and a resistance variation detection circuit.

10. A method of manufacturing an electronic chip protected against attacks, comprising:
    forming buried bars of a first conductivity type in a substrate of a second conductivity type;
    forming wells of the first conductivity type in an upper portion of the substrate, the buried bars being under, and spaced apart from, a lower level of the wells; and
    forming, inside and on top of the substrate and inside and on top of the wells, elements of electronic circuits and a circuit for detecting an anomaly of an electric characteristic of at least one of the buried bars.

11. The method of claim 10, wherein forming the buried bars comprises a boron implantation at a dose in a range from $1.5*10^{12}$ to $2.5*10^{12}$ ions/cm$^2$ with an energy greater than 3,500 keV.

12. The method of claim 10, further comprising forming an overdoped region of the second conductivity type above the buried bars and below the wells, the overdoped region having a higher doping level than the substrate.

13. An electronic chip comprising:
    a plurality of doped bars of first conductivity type that are buried in a substrate of a second conductivity type and are spaced apart from each other, and extend longitudinally substantially parallel to each other;
    a detection circuit for detecting an anomaly of an electric characteristic of at least one of the bars;
    wells of the first conductivity type formed in the substrate; and
    electronic circuit elements formed inside and on top of the substrate and inside and on top of the wells, wherein the bars are buried under a lower level of the wells and are spaced apart from the wells, wherein each end of each doped bar contacts a respective well of the wells of the first conductivity type.

14. The electronic chip of claim 13, further comprising an overdoped region of the second conductivity type positioned between the bars and the wells, wherein the overdoped region has a higher doping level than the substrate.

15. The electronic chip of claim 13, wherein the buried bars are series-connected to each other between first and second nodes, wherein the detection circuit is a circuit configured to detect an electric discontinuity between the first and second nodes.

16. The electronic chip of claim 13, wherein the bars are electrically connected to each other and the detection circuit is a carrier injection detection circuit configured to bias the bars and detect an anomaly of a bias current of the bars.

17. The electronic chip of claim 13, further comprising a plurality of end contacts, wherein the bars each include first and second ends respectfully connected to respective first and second end contacts of the plurality of end contacts and the detection circuit includes a circuit for detecting an anomaly of a resistance value between the first and second end contacts of the at least one of the bars.

18. The electronic chip of claim 17, wherein:
    the detection circuit is one of a plurality of detection circuits respectively connected to the buried bars; and each detection circuit includes a current source connected to the first end contact for the bar connected to the detection circuit, a reference potential terminal connected to the second end contact for the bar connected to the detection circuit, and a voltage detection circuit configured to detect an anomaly of a voltage between the first and second end contacts for the bar connected to the detection circuit.

19. An electronic chip comprising:
a plurality of doped bars of first conductivity type that are buried in a substrate of a second conductivity type, are spaced apart from each other, and extend longitudinally substantially parallel to each other; and
a detection circuit for detecting an anomaly of an electric characteristic of at least one of the bars, wherein the bars are electrically connected to each other and the detection circuit is a carrier injection detection circuit configured to bias the bars and detect an anomaly of a bias current of the bars.

20. The electronic chip of claim 19, wherein the detection circuit includes a resistive element conducting the bias current and a voltage detection circuit configured to detect a voltage across the resistive element.

21. The electronic chip of claim 19, further comprising a plurality of end contacts, wherein the bars each include first and second ends respectfully connected to respective first and second end contacts of the plurality of end contacts and the detection circuit includes a circuit for detecting an anomaly of a resistance value between the first and second end contacts of the at least one of the bars.

22. An electronic chip comprising:
a plurality of doped bars of first conductivity type that are buried in a substrate of a second conductivity type, are spaced apart from each other, and extend longitudinally substantially parallel to each other;
a detection circuit for detecting an anomaly of an electric characteristic of at least one of the bars; and
a plurality of end contacts, wherein the bars each include first and second ends respectfully connected to respective first and second end contacts of the plurality of end contacts and the detection circuit includes a circuit for detecting an anomaly of a resistance value between the first and second end contacts of the at least one of the bars.

23. The electronic chip of claim 22, wherein:
the detection circuit is one of a plurality of detection circuits respectively connected to the buried bars; and
each detection circuit includes a current source connected to the first end contact for the bar connected to the detection circuit, a reference potential terminal connected to the second end contact for the bar connected to the detection circuit, and a voltage detection circuit configured to detect an anomaly of a voltage between the first and second end contacts for the bar connected to the detection circuit.

24. The electronic chip of claim 22, further comprising a plurality of wells of the first conductivity type, wherein each end of each buried bar contacts a respective well of the plurality of wells.

* * * * *